United States Patent
Hanazaki

(10) Patent No.: US 8,202,671 B2
(45) Date of Patent: Jun. 19, 2012

(54) PROTECTIVE APPARATUS, MASK, MASK FORMING APPARATUS, MASK FORMING METHOD, EXPOSURE APPARATUS, DEVICE FABRICATING METHOD, AND FOREIGN MATTER DETECTING APPARATUS

(75) Inventor: Noritsugu Hanazaki, Funabashi (JP)

(73) Assignee: Nikon Corporation, Tokyo (JP)

( * ) Notice: Subject to any disclaimer, the term of this patent is extended or adjusted under 35 U.S.C. 154(b) by 219 days.

(21) Appl. No.: 12/729,396

(22) Filed: Mar. 23, 2010

(65) Prior Publication Data
US 2010/0271602 A1   Oct. 28, 2010

Related U.S. Application Data

(60) Provisional application No. 61/213,010, filed on Apr. 28, 2009.

(51) Int. Cl.
*G03F 1/00* (2012.01)
(52) U.S. Cl. .......................................................... 430/5
(58) Field of Classification Search ........ 430/5; 428/14; 355/75
See application file for complete search history.

(56) References Cited

U.S. PATENT DOCUMENTS

| | | |
|---|---|---|
| 6,208,407 B1 | 3/2001 | Loopstra |
| 6,262,796 B1 | 7/2001 | Loopstra et al. |
| 6,341,007 B1 | 1/2002 | Nishi et al. |
| 6,778,257 B2 | 8/2004 | Bleeker et al. |
| 6,897,963 B1 | 5/2005 | Taniguchi et al. |
| 2001/0004508 A1 | 6/2001 | Shirasaki et al. |
| 2006/0038974 A1* | 2/2006 | Sekihara .................... 355/75 |

FOREIGN PATENT DOCUMENTS

| | | |
|---|---|---|
| EP | 1 713 113 A1 | 10/2006 |
| JP | 2002-49145 | 2/2002 |
| JP | 2006-251480 | 9/2006 |
| JP | 4043232 | 11/2007 |
| WO | WO 2005/124836 | 12/2005 |
| WO | WO 2009/043885 | 4/2009 |

OTHER PUBLICATIONS

International Search Report, from the European Patent Office in corresponding International Application No. PCT/JP2010/057914, mailed Sep. 27, 2010.
Written Opinion of the International Searching Authority issued in corresponding International Application No. PCT/ JP2010/057914 mailed Sep. 27, 2010.

(Continued)

*Primary Examiner* — Stephen Rosasco
(74) *Attorney, Agent, or Firm* — Finnegan, Henderson, Farabow, Garrett & Dunner, L.L.P.

(57) ABSTRACT

A protective apparatus protects a predetermined area on a surface of a substrate. The protective apparatus includes: a frame portion that includes a pair of flexible portions which are disposed along a first direction and oppose each other, and is connected to the surface of the substrate to surround the predetermined area; and a thin film portion that is stretched across the frame portion to oppose the predetermined area and closes an opening portion formed by the frame portion. An end surface of the flexible portion on the thin film portion side has a curved shape which is concave toward a connecting portion with the substrate.

13 Claims, 10 Drawing Sheets

OTHER PUBLICATIONS

IBM, IP.com Electronic Publication, "Method for correction of Out of Plane Distortion in Photomasks using Pellicle Frame Distortion", IP.COM Journal, IP.COM Inc., West Henrietta, NY, US, pp. 1-2, (2009).

Cotte et al.; "Effects of Soft Pellicle Frame Curvature and Mounting Process on Pellicle-Induced Distortions in Advanced Photmasks", Proceedings of the International Society for Optical Engineering (SPIE), XP-002339119, vol. 5040, No. 1, pp. 1044-1054, (2003).

\* cited by examiner

US 8,202,671 B2

PROTECTIVE APPARATUS, MASK, MASK FORMING APPARATUS, MASK FORMING METHOD, EXPOSURE APPARATUS, DEVICE FABRICATING METHOD, AND FOREIGN MATTER DETECTING APPARATUS

CROSS-REFERENCE TO RELATED APPLICATION

This application is a non-provisional application claiming priority to and the benefit of U.S. provisional application No. 61/213,010, filed Apr. 28, 2009. The entire contents of which are incorporated herein by reference.

BACKGROUND

1. Field of the Invention

The present invention relates to a protection technique for protecting a predetermined area on the surface of a substrate.

2. Description of Related Art

Photolithography uses an exposure apparatus which illuminates a mask with exposure light and exposes a substrate with the exposure light from the mask. The mask is provided with a mask substrate (mask blank) and a protective apparatus which protects a pattern area on the surface of the mask substrate. The protective apparatus includes a frame portion, which is called a pellicle frame and is connected to the mask substrate, and a thin film portion, which is called a pellicle and is stretched across the frame portion. An example of a technique related to the mask is disclosed in Japanese Patent No. 4043232.

In the existing mask, the thin film portion deflects as a result of the mask substrate deflecting. Therefore, for example, in a case where the surface of the thin film portion is irradiated with light to detect a surface state (for example, existence of foreign matter), there is a possibility that the irradiation condition of the light and the detection condition of the light may be changed depending on the position of the thin film portion, thereby causing detection errors.

SUMMARY

A purpose of some aspects of the invention is to provide a protective apparatus capable of suppressing the deflection of a thin film portion, a mask, a mask forming apparatus, and a mask forming method. A purpose of some aspects of the invention is to provide an exposure apparatus capable of exposing a substrate through a mask that suppresses the deflection of a thin film portion, and a device manufacturing method. A purpose of some aspects of the invention is to provide a foreign matter detecting apparatus capable of detecting foreign matter adhered to the surface of a thin film portion of a mask that suppresses the deflection of the thin film portion.

According to a first aspect of the invention, there is provided a protective apparatus that protects a predetermined area on a surface of a substrate, including: a frame portion that includes a pair of flexible portions which are disposed along a first direction and oppose each other, and is connected to the surface of the substrate to surround the predetermined area; and a thin film portion that is stretched across the frame portion to oppose the predetermined area and closes an opening portion formed by the frame portion, wherein an end surface of the flexible portion on the thin film portion side has a curved shape which is concave toward a connecting portion with the substrate.

According to a second aspect of the invention, there is provided a mask including: a substrate having a pattern area on its surface; and the protective apparatus that is connected to the surface and protects the pattern area according to the first aspect.

According to a third aspect of the invention, there is provided a mask that is provided with a pattern area on a surface of a substrate, including: a frame portion that includes a pair of flexible portions which are disposed along a first direction and oppose each other, and is connected to the surface of the substrate to surround the pattern area; and a thin film portion that is stretched across the frame portion to oppose the pattern area and closes an opening portion formed by the frame portion, wherein an end surface of the flexible portion on the thin film portion side has a flat shape in a state where both end portions of the substrate in the first direction are supported from the thin film portion side.

According to a fourth aspect of the invention, there is provided a mask forming apparatus including: a substrate having a pattern area on its surface; the protective apparatus according to the first aspect, which is connected to the surface and protects the pattern area; and a pressing mechanism that includes a first pressing unit for pressing the substrate and a second pressing unit for pressing the frame portion, and presses at least one of the first and second pressing units in such a direction that the substrate and the frame portion become closer to each other, in a state where the pattern area and the thin film portion are opposed to each other, wherein the first or second pressing unit includes a contact portion which comes in contact with the substrate or the frame portion along a curve corresponding to the curved shape of the flexible portion.

According to a fifth aspect of the invention, there is provided a mask forming method of forming a mask having a protective apparatus according to the first aspect, wherein the protective apparatus includes a substrate having a pattern area on its surface and is connected to the surface to protect the pattern area, the mask forming method including: contacting the first pressing unit for pressing the substrate or the second pressing unit for pressing the frame portion to the substrate or the frame portion, respectively, along the curve corresponding to the curved shape of the flexible portion; and in a state where the pattern area and the thin film portion oppose each other, moving at least one of the first and second pressing units to be pressed in such a direction that the substrate and the frame portion become closer to each other.

According to a sixth aspect of the invention, there is provided an exposure apparatus including: a mask stage that holds the mask according to the second or third aspect, and moves the mask to an irradiation area of exposure light; and a substrate movement apparatus that holds a photosensitive substrate and moves the photosensitive substrate to the irradiation area of the exposure light through the mask, wherein the mask stage supports both end portions of the mask in the first direction from the thin film portion side.

According to a seventh aspect of the invention, there is provided a device fabricating method including: transferring the pattern of the mask according to the second or third aspect onto a photosensitive substrate; and processing the photosensitive substrate on which the pattern is transferred on the basis of the pattern.

According to an eighth aspect of the invention, there is provided a device fabricating method including: transferring a pattern of the mask on the photosensitive substrate using the exposure apparatus according to the sixth aspect; and processing the photosensitive substrate on which the pattern is transferred on the basis of the pattern.

According to a ninth aspect of the invention, there is provided a foreign matter detecting apparatus including: a support unit that supports both end portions of the mask according to the second or third aspect in the first direction from the thin film portion side; and a detecting unit that irradiates the surface of the thin film portion with line-shaped light along the first direction, receives the scattered light, and detects foreign matter adhered to the surface of the thin film portion on the basis of reception results of the scattered light.

According to the aspects of the invention, it is possible to suppress the deflection of the thin film portion of the protective apparatus for protecting the predetermined area on the surface of the substrate.

DESCRIPTION OF EMBODIMENTS

Hereinafter, exemplary embodiments of the invention will be described with reference to the accompanying drawings, although the invention is not limited thereto. In the following description, an XYZ orthogonal coordinate system is set, and a positional relationship between components will be described with reference to the XYZ orthogonal coordinate system. A predetermined direction on a horizontal plane is set to an X axial direction, a direction perpendicular to the X axial direction is set to a Y axial direction, and a direction (that is, a vertical direction) perpendicular to both the X axial direction and the Y axial direction is set to a Z axial direction. Rotation (inclination) directions about the X, Y, and Z axes are respectively set to θX, θY, and θZ.

<First Embodiment>

Figure 1:
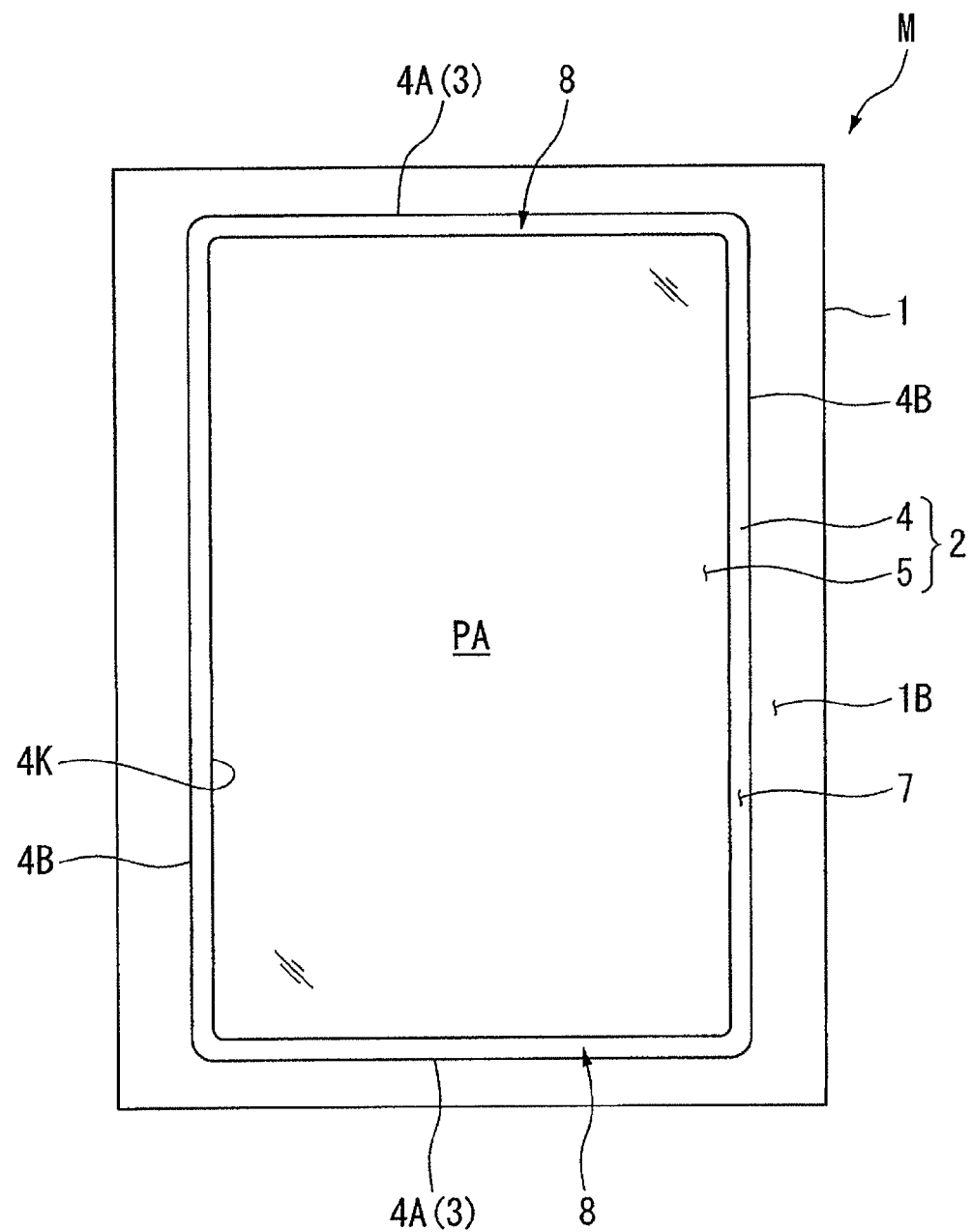
FIG. 1 is a plan view illustrating an example of a mask according to a first embodiment.
Figure 2:
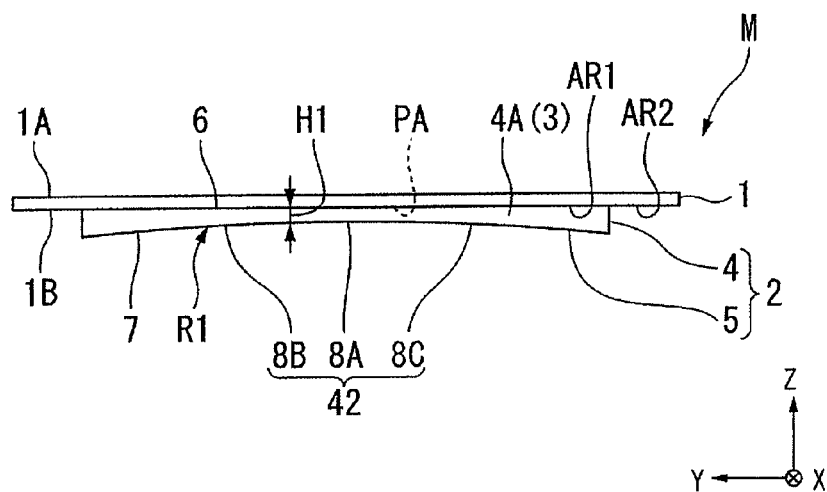
FIG. 2 is a side view illustrating the example of the mask according to the first embodiment.
Figure 3:
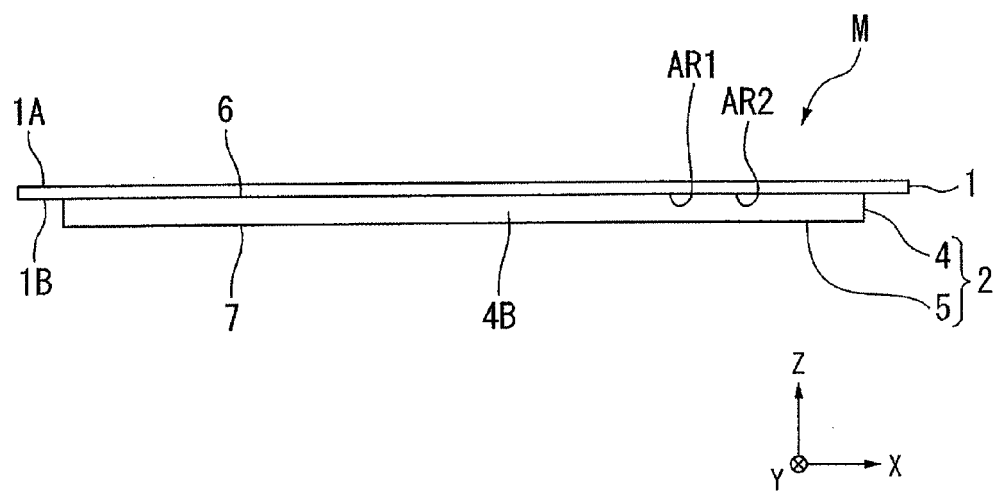
FIG. 3 is a side view illustrating the example of the mask according to the first embodiment.

A first embodiment will be described. FIG. 1 is a plan view illustrating an example of a mask M according to the first embodiment, and FIGS. 2 and 3 are sectional views of the mask M. FIG. 1 is a view of the mask M as viewed from a −Z side, FIG. 2 is a view of the mask M as viewed from a −X side, and FIG. 3 is a view of the mask M as viewed from a −Y side.

In FIGS. 1, 2 and 3, the mask M includes a mask substrate 1 having a pattern area PA on the surface (lower surface), and a protective apparatus 2 which is connected to the surface of the mask substrate 1 for protecting the pattern area PA provided on the surface of the mask substrate 1.

The mask M includes an upper surface (a surface facing a +Z side) 1A and a lower surface (a surface facing the −Z side) 1B that opposes the upper surface 1A. The protective apparatus 2 is disposed to oppose the lower surface 1B of the mask substrate 1.

FIGS. 1, 2 and 3 show the mask M in a state where gravity is not applied. In FIGS. 1, 2 and 3, the mask M is disposed so that the surfaces 1A and 1B of the mask substrate 1 and the XY plane are substantially parallel to each other. In the following description, the state where gravity is not applied is suitably referred to as a reference state. Therefore, the mask M in the reference state is shown in FIGS. 1 to 3. In the reference state, the upper surface 1A and the lower surface 1B of the mask substrate 1 are maintained in a flat plane shape parallel to the XY plane.

The mask substrate 1 includes a light transmitting type substrate (glass substrate) as a so-called mask blanks, and a shielding film disposed on the substrate surface. The main component of the substrate is, for example, quartz glass. The main component of the shielding film is, for example, chromium (Cr). The shielding film is patterned on the substrate to form a mask pattern. The mask pattern (shielding film) is disposed in an area (central area) excluding peripheral zones of the surface (lower surface 1B) of the substrate. In this embodiment, the pattern area PA corresponds to the central area.

The protective apparatus 2 includes a pellicle frame 4 which is connected to the lower surface 1B of the mask substrate 1 and surrounds the pattern area PA, and a pellicle 5 which is stretched across the pellicle frame 4 to oppose the pattern area PA and closes an opening portion 4K formed by the pellicle frame 4. The pellicle frame 4 includes a pair of flexible portions 3 which are disposed along the Y axial direction and oppose each other.

The pellicle frame 4 is made of aluminum that undergoes, for example, a black aluminum anodizing process. The pellicle 5 is made of, for example, cellulose. Otherwise, the pellicle frame 4 may be made of a synthetic resin or the like.

The pellicle frame 4 includes a pair of first portions 4A extending in the Y axial direction and a pair of second portions 4B extending in the X axial direction substantially perpendicular to the Y axial direction and is connected to the mask substrate 1. The first portions 4A and the second portions 4B are connected to one another to form the rectangular frame and the opening portion 4K in a plan view. In the pellicle frame 4, first end surfaces 6 which are one end surfaces of the first portion 4A and the second portion 4B on the +Z side in the figure are connected to the mask substrate 1. The lower surface 1B of the mask substrate 1 includes a first area AR1 opposing the first end surface 6 and a second area AR2 around the first area AR1.

The pellicle 5 is stretched over second end surfaces 7 which are the other end surfaces of the first and second portions 4A and 4B on the −Z side in the figure. A predetermined gap is formed between the pellicle 5 and the mask substrate 1 by the pellicle frame 4.

The first portion 4A includes the flexible portion 3, and the flexible portion 3 is disposed inside the first portion 4A. In other words, at least a part of the first portion 4A is flexible.

As illustrated in FIG. 2, in the reference state, at least a part of the second end surface 7 of the first portion 4A is not parallel to the first end surface 6 (in the figure, nonparallel to the XY plane). In this embodiment, in the first portion 4A including the flexible portion 3, the second end surface 7 on the pellicle 5 side in the reference state has a curved shape which is concave toward the first end surface 6 which constitutes a connecting portion with the mask substrate 1. Furthermore, in this embodiment, in the first portion 4A including the flexible portion 3, the second end surface 7 on the pellicle 5 side in the reference state has a curved shape along a predetermined deflection curve R1.

In the reference state, the first end surface 6 of the first portion 4A is flat and is substantially parallel to the XY plane (the lower surface 1B of the mask substrate 1). Namely, in the first portion 4A including the flexible portion 3, the second end surface 7 on the pellicle 5 side is formed in the curved shape which is concave toward the mask substrate 1 along the predetermined deflection curve R1 in the state where the first end surface 6 on the mask substrate 1 side is flat.

In this embodiment, in the first portion 4A, a distance (height) H1 between the first and second end surfaces 6 and 7 in the Z axial direction varies with a position in the Y axial direction. The distance H1 is shortest at the substantially center portion of the first portion 4A in the Y axial direction and gradually increases toward the +Y side end and the −Y side end.

In this embodiment, the second end surface 7 of the first portion 4A includes a concave portion 8 which is concave in the +Z direction (on the mask substrate 1 side). A vertex of the concave portion 8 is substantially at the center of the second end surface 7 in the Y axial direction.

The concave portion 8 is defined by a curved surface portion 8A including the vertex, a first inclined portion 8B which is inclined downwardly toward the +Y side end of the second end surface 7 from the curved surface portion 8A in the Y axial direction, and a second inclined portion 8C which is inclined downwardly toward the −Y side end of the second end surface 7 from the curved surface portion 8A. The +Y side end and the −Y side end of the second end surface 7 of the first portion 4A are smoothly connected to the second end surface 7 of the second portion 4B.

In this embodiment, in the reference state, the second end surface 7 of the second portion 4B is substantially flat and substantially parallel to the XY plane. Similarly, in the reference state, the first end surface 6 of the second portion 4B is substantially flat and substantially parallel to the XY plane.

In the pellicle frame 4, the second portion 4B which is different from the first portion 4A including the flexible portion 3 is formed so that its second end surface 7 on the pellicle 5 side and its first end surface 6 on the connecting portion side of the mask substrate 1 are parallel to each other.

In addition, the sentence explaining that the first end surface 6 and the second end surface 7 of the second portion 4B are parallel to each other is not limited to a case where they are strictly parallel to each other and includes a case where they are substantially (almost) parallel to each other. In addition, it is preferable that the first end surface 6 and the second end surface 7 of the second portion 4B be parallel to each other; however, they are not limited to a parallel relationship and, for example, may be formed to be inclined to each other.

In this embodiment, the shape of the mask substrate 1 in the XY plane is rectangular. In this embodiment, the shape of the mask substrate 1 in the XY plane is a rectangular shape which is long in the X axial direction.

The opening portion 4K is provided inside the pair of first portions 4A and the pair of second portions 4B. The shape of the opening portion 4K in the XY plane is rectangular. In this embodiment, for example, a length of the first portion 4A in the Y axial direction is shorter than that of the second portion 4B in the X axial direction. In this embodiment, the shape of the opening portion 4K in the XY direction is a rectangular shape which is long in the X axial direction.

Figure 4:
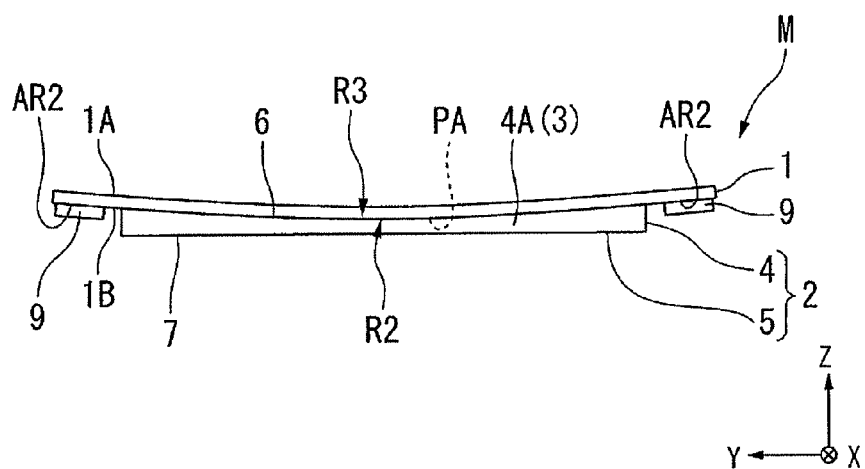
FIG. 4 is a side view illustrating the example of the mask according to the first embodiment.

FIG. 4 illustrates a state where both end portions of the mask substrate 1 in the Y axial direction are supported by a predetermined support member 9 from the pellicle 5 side. FIG. 4 illustrates the mask M in a state where gravity is applied. In the mask M, the second area AR2 of the lower surface 1B of the mask substrate 1 can be supported by the support member 9.

As illustrated in FIG. 4, the support member 9 supports both end portions of the lower surface 1B of the mask substrate 1 in the Y axial direction from the outside of the protective apparatus 2 (the pellicle frame 4). Both end portions of the lower surface 1B of the mask substrate 1 in the Y axial direction refers to areas between the edges of the mask substrate 1 in the Y axial direction and the protective apparatus 2 in the lower surface 1B of the mask substrate 1 provided with the protective apparatus 2.

As illustrated in FIG. 4, in this embodiment, the first portion 4A including the flexible portion 3 formed in such a shape that the second end surface 7 of the first portion 4A is flat in the state where both end portions of the mask substrate 1 in the Y axial direction are supported by the support member 9 from the pellicle 5 side (−Z side).

That is, in the case where both end portions of the lower surface 1B of the mask substrate 1 in the Y axial direction are supported, the mask substrate 1 deflects due to the gravity, in other words, due to the weight of the mask M itself. Furthermore, as the mask substrate 1 deflects, the first portion 4A (the flexible portion 3) of the pellicle frame 4, which is connected to the mask substrate 1 deflects as a result of the mask substrate 1 deflecting.

In this embodiment, the deflection curve R1 of the second end surface 7 of the first portion 4A in the reference state is determined so that the second end surface 7 of the pellicle frame 4 is substantially flat, that is, substantially parallel to the XY plane when the mask substrate 1 deflects convexly toward the −Z side due to its own weight. Therefore, as illustrated in FIG. 4, when the mask substrate 1 deflects due to its own weight, the second end surface 7 thereof becomes substantially flat.

In this embodiment, the deflection curve R1 of the second end surface 7 of the first portion 4A in the reference state is a curve complementary to a deflection curve R2 of the pattern area PA of the lower surface 1B of the mask substrate 1 (in other words, a symmetrical curve with respect to the XY plane) in the state where both end portions of the mask substrate 1 in the Y axial direction are supported from the pellicle 5 side.

In FIG. 4, the support member 9 supports the lower surface 1B of the mask substrate 1 so that both end portions of the lower surface 1B of the mask substrate 1 in the Y axial direction are substantially parallel to the XY plane. In this embodiment, the deflection curve R1 of the second end surface 7 of the first portion 4A in the reference state is substantially the same as the deflection curve R2 of the pattern area PA of the lower surface 1B of the mask substrate 1 when both end portions of the mask substrate 1 in the Y axial direction are supported from the pellicle 5 side in the state where both end portion of the lower surface 1B of the mask substrate 1 in the Y axial direction are substantially parallel to the XY plane.

In addition, a deflection curve R3 of the first end surface 6 of the first portion 4A in the state where both end portions of the mask substrate 1 in the Y axial direction are supported from the pellicle 5 side is substantially the same as the deflection curve R2 of the pattern area PA of the lower surface 1B of the mask substrate 1 in the state where both end portions of the mask substrate 1 in the Y axial direction are supported from the pellicle 5 side.

That is, the first end surface 6 of the first portion 4A in the state where both end portions of the mask substrate 1 in the Y axial direction are supported from the pellicle 5 side, is deflected so that the second end surface 7 of the first portion 4A is flat. The deflection curve R3 of the first end surface 6 of the first portion 4A in the state where both end portions of the mask substrate 1 in the Y axial direction are supported from the pellicle 5 side is the curve complementary to the deflection curve R1 of the second end surface 7 of the first portion 4A (in other words, the symmetrical curve with respect to the XY plane) in the reference state.

As described above, in this embodiment, when the mask substrate 1 deflects convexly toward the −Z side due to its own weight, the second end surface 7 of the pellicle frame 4 substantially flat, that is, substantially parallel to the XY plane. In other words, the first portion 4A including the flexible portion 3 is deflected so that the second end surface 7 of the pellicle frame 4 is flattened along the XY plane. In addition, when the mask substrate 1 deflects convexly toward the −Z side due to its own weight, the pellicle 5 stretched across the pellicle 4 is flattened along the XY plane. In other words, in this embodiment, when the mask substrate 1 is deflected convexly toward the −Z side due to its own weight, the first portion 4A including the flexible portion 3 is deflected so that the pellicle 5 is flattened along the XY plane.

The deflection curve R1 of the second end surface 7 may be obtained by, for example, a preliminary experiment or a simulation. The deflection curve R1 may be determined on the basis of at least one of, for example, the thickness of the mask substrate 1, an interval between support portions of the mask substrate 1 in the Y axial direction, a property value related to the rigidity of the mask substrate 1, and the specific gravity of the mask substrate 1.

The thickness of the mask substrate 1 is a distance between the upper surface 1A and the lower surface 1B. The interval between the support portions of the mask substrate 1 in the Y axial direction is an interval in the Y axial direction between the portions where the two support members 9 arranged in the Y axial direction support the mask substrate 1. The property value related to the rigidity of the mask substrate 1 includes at least one of Young's modulus, Poisson's ratio, section modulus, and modulus of rigidity.

Figure 5:
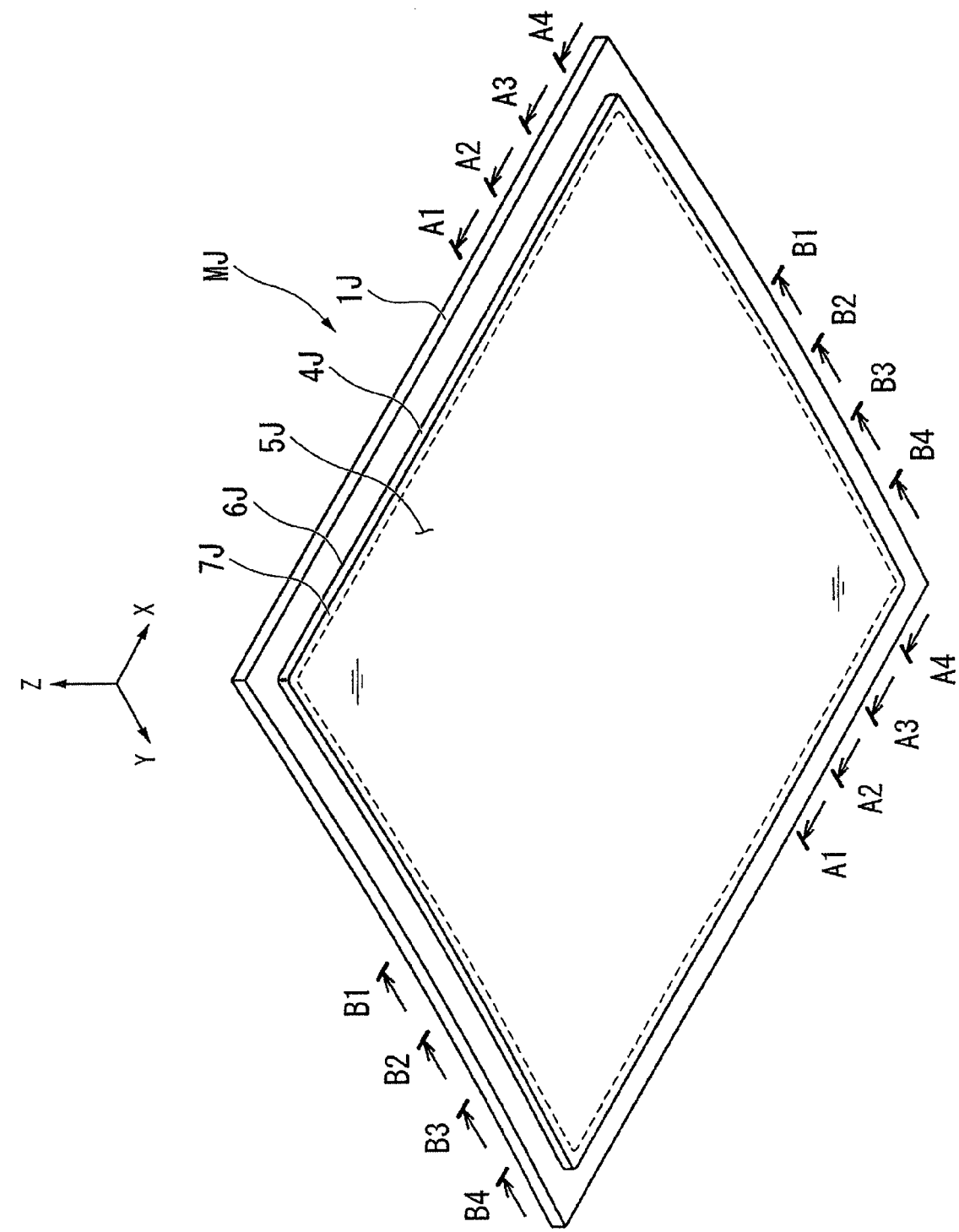
FIG. 5 is a perspective view illustrating an example of a mask according to a comparative example.
Figure 6:
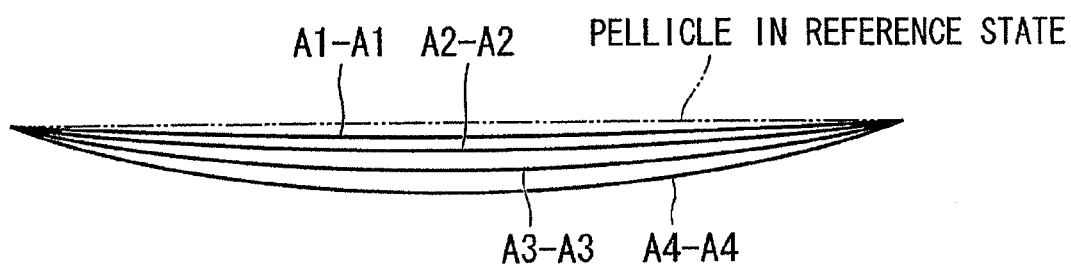
FIG. 6 is a view illustrating an example of a pellicle state of the mask according to the comparative example.
Figure 7:
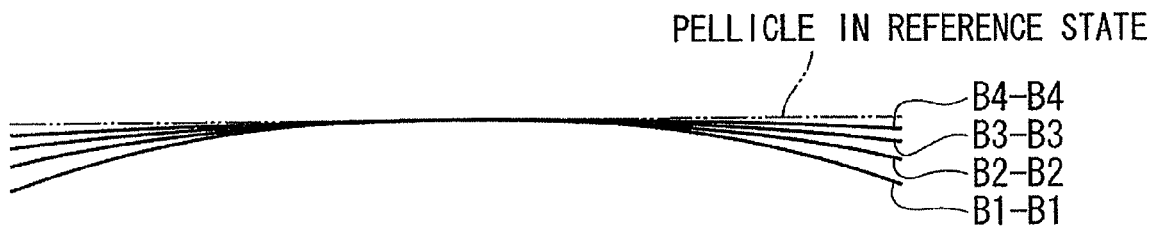
FIG. 7 is a view illustrating the example of the pellicle state of the mask according to the comparative example.

FIGS. 5, 6, and 7 illustrate a mask MJ according to a comparative example. In the reference state, a first end surface 6J and a second end surface 7J of a pellicle frame 4J provided in the mask MJ are flat and substantially parallel to each other. Furthermore, in the reference state, a pellicle 5J provided in the mask MJ is substantially parallel to the XY plane.

FIGS. 6 and 7 are views illustrating the shape of the pellicle 5J when both end portions of a mask substrate 1J of the mask MJ shown in FIG. 5 in the Y axial direction are supported from the pellicle 5J side. FIG. 6 is a cross-sectional view taken along the A1-A1 line, A2-A2 line, A3-A3 line, and A4-A4 line of FIG. 5. FIG. 7 is a cross-sectional view taken along the B1-B1 line, B2-B2 line, B3-B3 line, and B4-B4 line of FIG. 5.

As illustrated in FIGS. 6 and 7, in the mask MJ according to the comparative example, as the mask substrate 1J deflects due to its own weight, the pellicle 5J is not aligned with the XY plane but deflects.

As described above with reference to FIGS. 1 to 4, in the mask M according to this embodiment, even in the case where the mask substrate 1 deflects due to its own weight, it is possible to suppress the deformation of the pellicle 5 and allow the pellicle 5 to be aligned with the XY plane.

Figure 8:
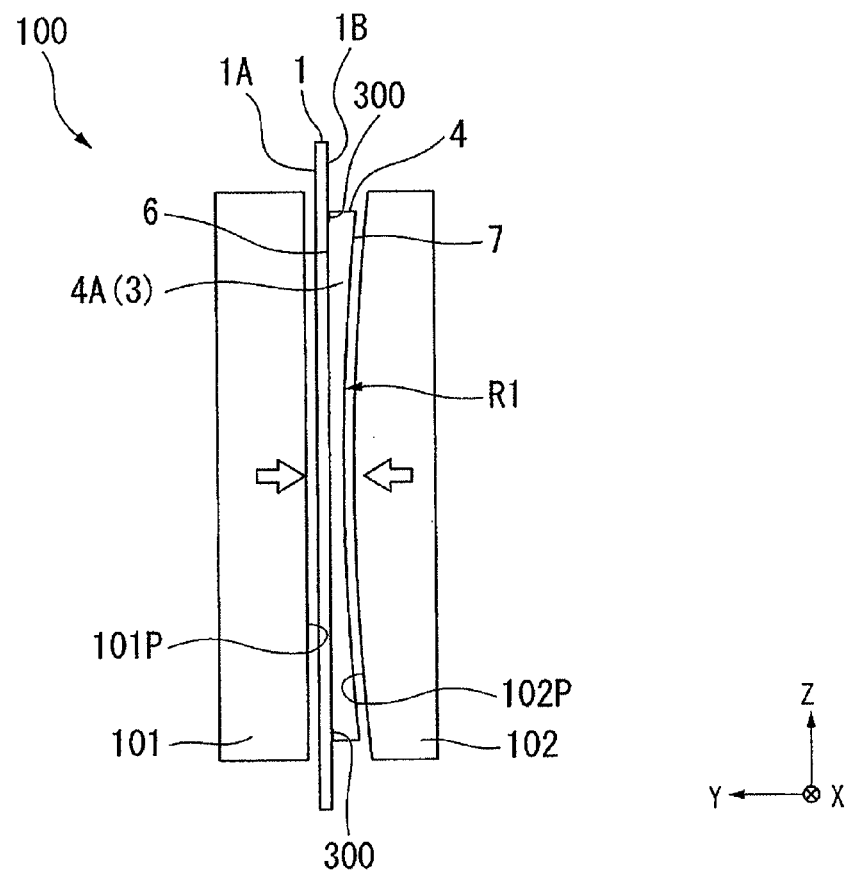
FIG. 8 is a view illustrating an example of a mask forming method according to the first embodiment.

Next, an example of a method of forming the mask M according to this embodiment will be described. FIG. 8 is a view illustrating an example of an apparatus 100 for forming the mask M according to the first embodiment. As illustrated in FIG. 8, the forming apparatus 100 includes a first member 101 having a first surface 101P which may oppose the upper surface 1A of the mask substrate 1, and a second member 102 having a second surface 102P which may oppose the second end surface 7 of the pellicle frame 4. The first member 101 is a pressing pad (pressing unit) for pressing the mask substrate 1, and the second member 102 is a pressing pad (pressing unit) for pressing the pellicle frame 4. The first and second surfaces 101P and 102P are pressing surfaces which come in contact with the upper surface 1A and the second end surface 7, respectively.

At least one of the first and second members 101 and 102 is driven by an actuator (not shown). The forming apparatus 100 interposes the mask substrate 1 and the pellicle frame 4 between the first and second members 101 and 102, and in a state where the first surface 101P comes in contact with the upper surface 1A and the second surface 102P comes in contact with the second end surface 7, moves at least one of the first and second members 101 and 102 so that the mask substrate 1 and the pellicle frame 4 are pressed in a direction to become closer to each other. Accordingly, the forming apparatus 100 allows the lower surface 1B of the mask substrate 1 to come in close contact with the first end surface 6 of the pellicle frame 4.

In this embodiment, the forming apparatus 100 allows the lower surface 1B of the mask substrate 1 to come in close contact with the first end surface 6 of the pellicle frame 4 in a state where an adhesive portion (bonding portion) 300 is interposed between the lower surface 1B and the first end surface 6. Accordingly, the mask substrate 1 and the pellicle frame 4 are adhered through the adhesive portion 300.

In addition, in this embodiment, the first surface 101P is formed in a flat plane shape, and at least a part of the second surface 102P has a curved shape along the deflection curve R1 of the second end surface 7 in the reference state. Accordingly, the first and second surfaces 101P and 102P properly come in contact with the upper surface 1A and the second end surface 7, respectively.

In this embodiment, in a state where the forming apparatus 100 disposes the upper and lower surfaces 1A and 1B of the mask substrate 1 and the first end surface 6 of the pellicle frame 4 perpendicularly with respect to the XY plane (horizontal plane), that is, in a state where the mask substrate 1 and the pellicle frame 4 are raised vertically, the forming apparatus 100 allows the lower surface 1B of the mask substrate 1 and the first end surface 6 of the pellicle frame 4 to come in close contact with each other so that the lower surface 1B of the mask substrate 1 is adhered to the first end surface 6 of the pellicle frame 4 in the reference state. Here, being perpendicular to the horizontal surface is not limited to a case of being strictly perpendicular, and is a concept including a case of being substantially perpendicular. That is, the upper and lower surfaces 1A and 1B and the first end surface 6 may be disposed along the surface which is substantially parallel to the vertical surface.

In addition, the contact between the first surface 101P and the upper surface 1A and the contact between the second surface 102P and the second end surface 7 are not limited to surface contact (surface-to-surface contact); for example, it should be understood that the first surface 101P is a surface (contact surface) including front ends of a plurality of convex portions that are discretely distributed on the surface of the first member 101 opposing the mask substrate 1, and the second surface 102P and the second member 102 have the same surfaces as those. In other words, the first member 101 includes contact portions that contact the upper surface 1A of the mask substrate 1 along a predetermined plane (in this embodiment, the surface substantially in parallel with the vertical surface), and the second member 102 includes contact portions that contact the flexible portion 3 (the first portion 4A) along the second end surface 7 as the curved surface (that is, a curved surface conforming to the deflection curve R1 which is complementary to the deflection curve R2) conforming to the deflection curve R1. In addition, the second member 102 includes contact portions (not shown) which contact the second portion 4B in the state where they contact the flexible portion 3 (first portion 4A).

Figure 9:
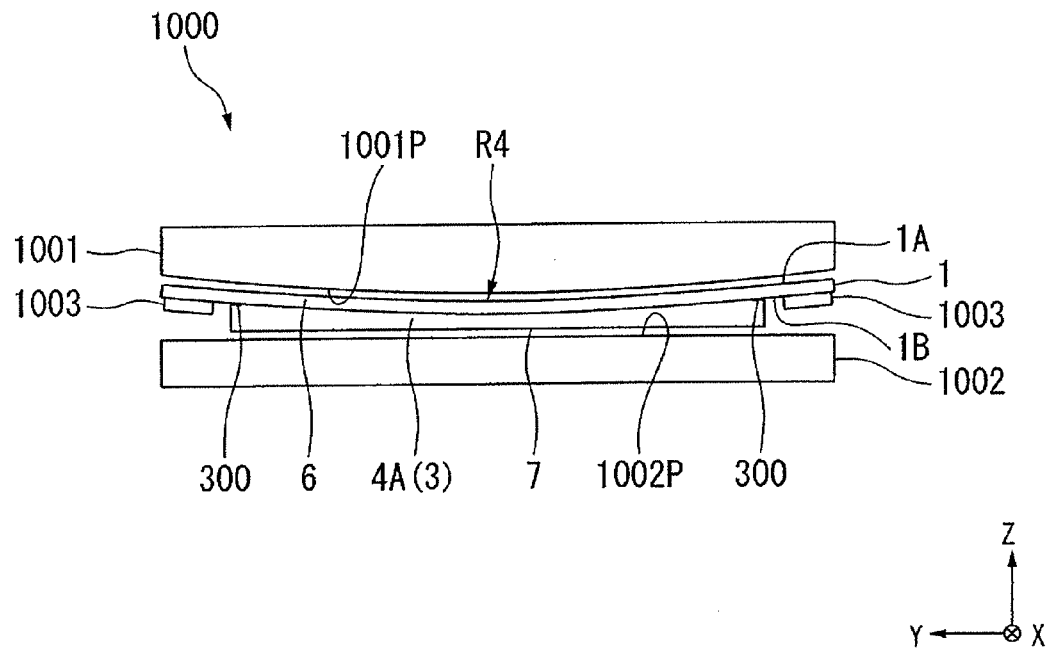
FIG. 9 is a view illustrating the example of the mask forming method according to the first embodiment.

FIG. 9 is a view illustrating an example of a forming apparatus 1000 having a different type from that of FIG. 8. The forming apparatus 1000 illustrated in FIG. 9 includes a first member 1001 (pressing unit) having a first surface 1001P (pressing surface) which may oppose the upper surface 1A of the mask substrate 1 and a second member 1002 (pressing unit) having a second surface 1002P (pressing surface) which may oppose the second end surface 7 of the pellicle frame 4. Furthermore, the forming apparatus 1000 includes a support apparatus 1003 for supporting both end portions of the mask substrate 1 in the Y axial direction.

At least one of the first and second members 1001 and 1002 is driven by an actuator (not shown). The forming apparatus 1000 interposes the mask substrate 1 and the pellicle frame 4 between the first and second members 1001 and 1002 in a state where both end portions of the mask substrate 1 in the Y axial direction are supported by the support apparatus 1003 along the horizontal surface, and moves at least one of the first and second members 1001 and 1002 in a state where the first and second surfaces 1001P and 1002P contact the upper surface 1A and the second end surface 7, respectively, so that the mask substrate 1 and the pellicle frame 4 are pressed in a direction to become closer to each other. Accordingly, the forming apparatus 1000 allows the lower surface 1B of the mask substrate 1 to come in close contact with the first end surface 6 of the pellicle frame 4.

In this embodiment, the forming apparatus 1000 allows the lower surface 1B of the mask substrate 1 to come in close contact with the first end surface 6 of the pellicle frame 4 in the state where an adhesive portion (bonding portion) 300 is interposed between the lower surface 1B and the first end surface 6. Accordingly, the mask substrate 1 and the pellicle frame 4 are adhered through the adhesive portion 300.

In this embodiment, the second surface 1002P is formed in a flat plane shape, and at least a part of the first surface 1001P has a curved shape along the deflection curve R4 (curves substantially in parallel to the deflection curves R2 and R3) of the upper surface 1A in the state where both end portions of the mask substrate 1 in the Y axial direction are supported by the support apparatus 1003 along the horizontal surface. Accordingly, the first and second surfaces 1001P and 1002P properly come in contact with the upper surface 1A and the second end surface 7, respectively.

In this embodiment, in a state where both end portions of the mask substrate 1 in the Y axial direction are supported along the horizontal surface, that is, in a state where the second end surface 7 is parallel to the horizontal surface, the forming apparatus 1000 allows the lower surface 1B of the mask substrate 1 and the first end surface 6 of the pellicle frame 4 to come in close contact with each other so that the mask substrate 1 is adhered in a state close to a practical use state. Here, being parallel to the horizontal surface is not limited to a case of being strictly parallel and is a concept including a case of being substantially parallel. That is, the second end surface 7 may be disposed along the surface which is substantially parallel to the horizontal surface.

In addition, the contact between the first surface 1001P and the upper surface 1A and the contact between the second surface 1002P and the second end surface 7 are not limited to surface contact (surface-to-surface contact). Namely, the second member 1002 includes contact portions that contact the second end surface 7 along a predetermined plane (in this embodiment, the surface substantially parallel to the horizontal surface), and the first member 1001 includes contact portions that contact the mask substrate 1 along the upper surface 1A as a curved surface (that is, a curved surface conforming to the deflection curve R2) conforming to the deflection curve R4; in addition, the second member 102 includes contact portions (not shown) which contact the second portion 4B in the state where they contact the flexible portion 3 (the first portion 4A).

Figure 10:
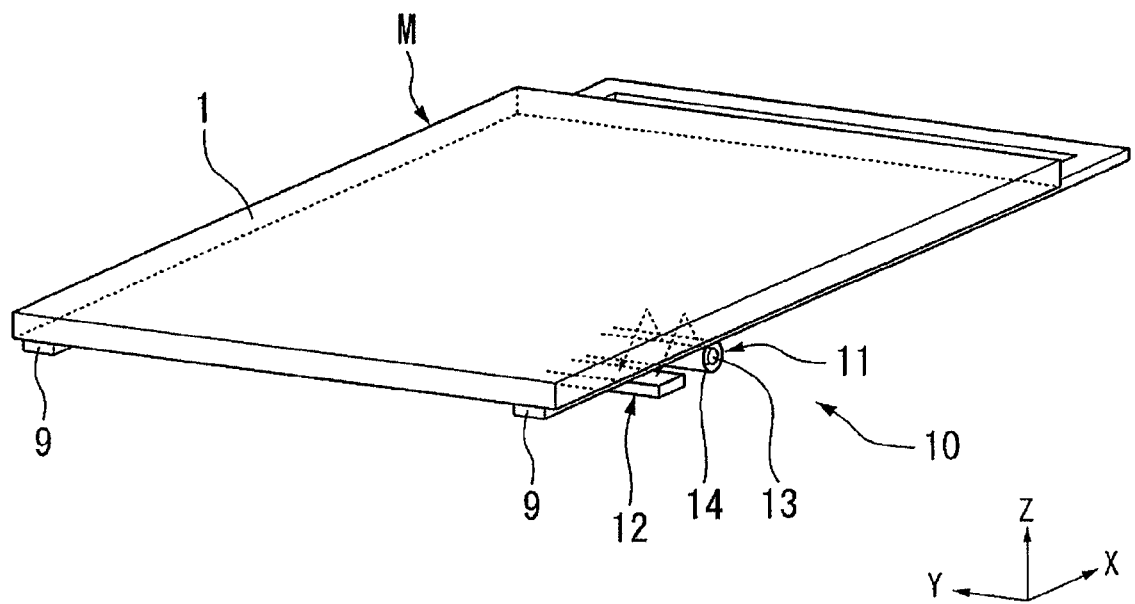
FIG. 10 is a view illustrating an example of a foreign matter detecting apparatus according to the first embodiment.
Figure 11:
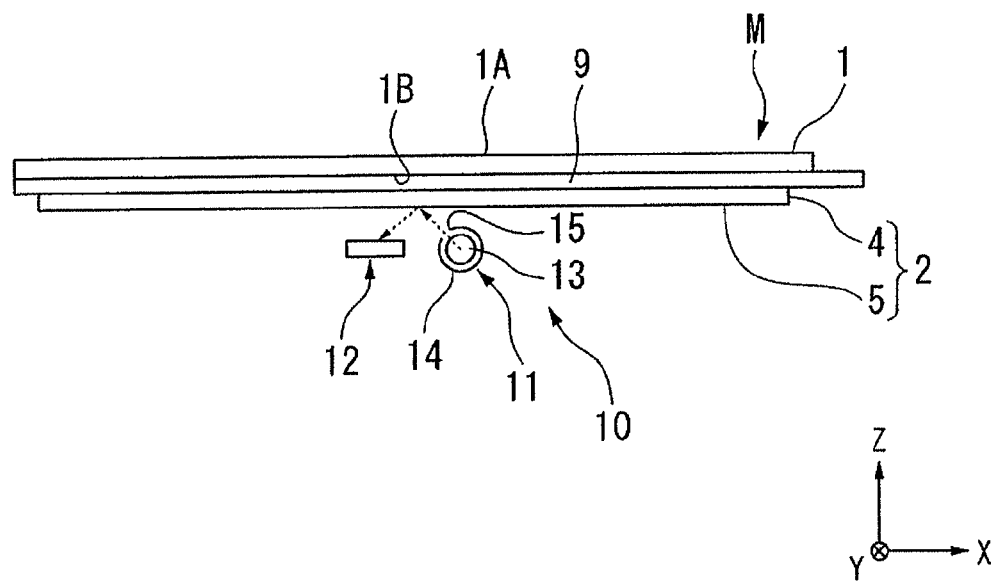
FIG. 11 is a view illustrating the example of the foreign matter detecting apparatus according to the first embodiment.

FIGS. 10 and 11 are views illustrating an example of a foreign matter detecting apparatus 10 which detects foreign matter on the surface of the pellicle 5 of the mask M according to this embodiment. In FIGS. 10 and 11, the foreign matter detecting apparatus 10 includes the support member 9 that supports both end portions of the lower surface 1B of the mask substrate 1 of the mask M in the Y axial direction from the pellicle 5 side, a light projecting unit 11 which irradiates the surface of the pellicle 5 with light in line with the Y axial direction, and a detecting unit 12 which receives scattered light from the pellicle 5 and detects foreign matter adhered to the surface of the pellicle 5 on the basis of a reception result of the scattered light.

In this embodiment, the light projecting unit 11 includes a fluorescent tube 13 extending in the Y axial direction, and a cover portion 14 which encloses the fluorescent tube 13 and includes a long slit opening 15 extending in the Y axial direction. The slit opening 15 is disposed to face the pellicle 5. Light emitted from the fluorescent tube 13 irradiates the surface of the pellicle 5 through the slit opening 15 of the cover portion 14 obliquely. The light emitted from the fluorescent tube 13 is confined to a line-shaped light having a directionality as it passes through the slit opening 15.

The detecting unit 12 includes an image capturing device (for example, a charge coupled device, i.e., a CCD) extending in the Y axial direction. In a case of detecting foreign matter on the surface (lower surface) of the pellicle 5, the foreign matter detecting apparatus 10 irradiates the pellicle 5 with light from the light projecting unit 11 in the state where the mask substrate 1 is supported by the support member 9. In the case where foreign matter exists on the surface of the pellicle 5, due to the light irradiating the pellicle 5, scattered light occurs from the pellicle 5. The detecting unit 12 may receive the scattered light. The detecting unit 12 may detect foreign matter adhered to the surface of the pellicle 5 on the basis of the reception result of the scattered light. Here, the detecting unit 12 may have a configuration in which an optical image of the foreign matter on the surface of the pellicle 5 is detected by an image capturing device through an optical system.

In this embodiment, the foreign matter detecting apparatus 10 emits light from the light projecting unit 11 while moving the mask M supported by the support member 9 relative to the light projecting unit 11 and the detecting unit 12 in the X axial direction. The detecting unit 12 receives the scattered light from the pellicle 5 while being moved together with the light projecting unit 11 so as to be moved relative to the mask M. Accordingly, the foreign matter detecting apparatus 10 may detect foreign matter across almost the entire area of the surface (lower surface) of the pellicle 5.

In the foreign matter detecting apparatus 10 in this embodiment, the surface of the pellicle 5 disposed flatly along the XY plane may be detected while suppressing the deflection of the pellicle 5, thereby properly detecting foreign matter over the entire surface of the pellicle 5; for example, with regard to the mask MJ according to an existing technique illustrated in FIG. 5, in the case where the mask MJ is supported by the support member 9, as illustrated in FIGS. 6 and 7, the pellicle 5J deflects (deforms), and an arrangement relationship between the pellicle 5J and the foreign matter detecting apparatus 10 changes with the position on the surface. That is, a light irradiation condition, a light detection condition, and the like change with the position on the surface of the pellicle 5J. Therefore, there is a concern that the foreign matter detecting apparatus 10 cannot ensure uniform detection precision over the entire surface of the pellicle 5J and causes detection errors. On the contrary, with regard to the mask M in this embodiment, the foreign matter detecting apparatus 10 may uniformly maintain the arrangement relationship with the pellicle 5 over the entire surface of the pellicle 5; for example, in the case where the detecting unit 12 detects an optical image of the surface of the pellicle 5 using the image capturing device through the optical system, the pellicle 5 may be maintained within the depth of focus (depth of field) of the optical system over the entire surface. Accordingly, with regard to the mask M in this embodiment, the foreign matter detecting apparatus 10 ensures good detection precision over the entire surface of the pellicle 5 and can obtain good detection results over the entire surface of the pellicle 5.

Figure 12:
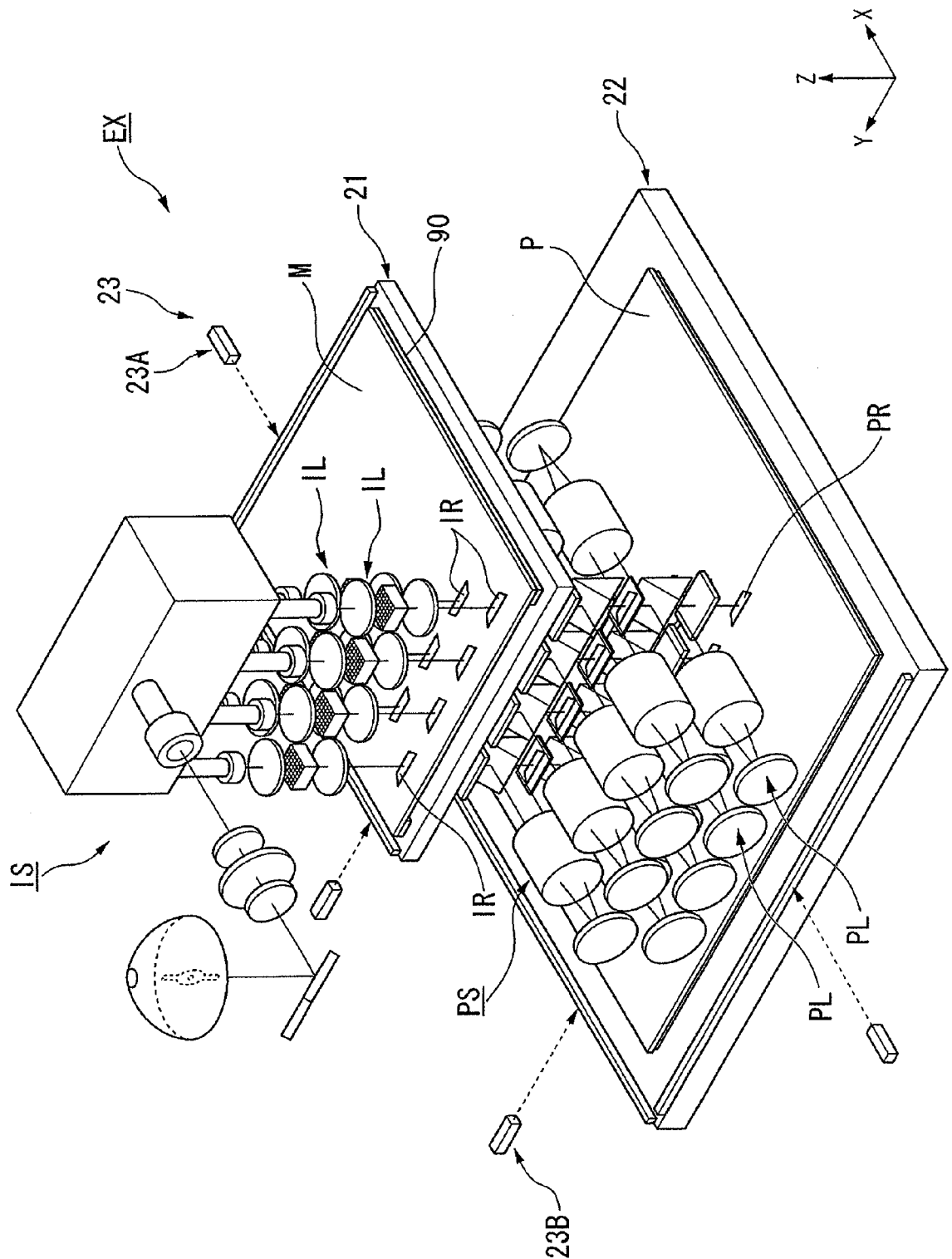
FIG. 12 is a perspective view illustrating an example of an exposure apparatus according to the first embodiment.

FIG. 12 is a view illustrating an example of an exposure apparatus EX according to this embodiment. In FIG. 12, the exposure apparatus EX includes a mask stage 21 which holds the mask M and moves the mask M to an irradiation area of exposure light EL, and a substrate stage 22 as a movement apparatus for holding a substrate P as a photosensitive substrate and moving the substrate P to an irradiation area of the exposure light EL through the mask M.

In this embodiment, the mask stage 21 supports both end portions of the lower surface 1B of the mask substrate 1 of the mask M in the Y axial direction from the pellicle 5 side. Accordingly, it is possible to suppress the deflection of the pellicle 5 during an exposure.

In addition, the exposure apparatus EX includes an illumination system IS which illuminates the mask M held by the mask stage 21 with the exposure light EL, a projection system PS which projects an image of a pattern of the mask M illuminated with the exposure light EL onto the substrate P held by the substrate stage 22, and an interferometer system 23 which measures positions of the mask stage 21 and the substrate stage 22.

The substrate P includes a base material made of, for example, a glass plate and a photosensitive film (applied photosensitive agent) formed on the base material. In this embodiment, the substrate P includes a large glass plate called a mother glass, and the size of one side of the substrate P is, for example, 500 mm or greater. In this embodiment, as the base material of the substrate P, a rectangular glass plate of which one side is about 3000 mm in length is used.

The illumination system IS illuminates a predetermined illumination area IR with the exposure light EL. The illumination area IR is an irradiation area of the exposure light EL emitted from the illumination system IS. The illumination system IS illuminates at least a part of the mask M disposed on the illumination area IR with a uniform illuminance distribution.

The mask stage 21 includes a support unit 90 that supports both end portions of the lower surface 1B of the mask substrate 1 of the mask M in the Y axial direction from the pellicle 5 side. The mask stage 21 may move the mask M to the illumination area IR by an operation of a first drive system (not shown) including, for example, a linear motor. In this embodiment, the mask stage 21 is movable in three directions which are the X and Y axial directions and the θZ direction.

The projection system PS irradiates a predetermined projection area PR with the exposure light EL. The projection area PR is an irradiation area of the exposure light EL emitted from the projection system PS. The projection system PS projects the image of the pattern of the mask M onto at least a part of the substrate P placed on the projection area PR at a predetermined projection magnification. The projection system PS projects the image of the pattern of the mask M onto at least a part of the substrate P placed on the projection area PR.

The substrate stage 22 includes a support portion that supports at least a part of the rear surface of the substrate P. The substrate stage 22 may hold and move the substrate P to the projection area PR by an operation of a second drive system (not shown) including, for example, a linear motor. In this embodiment, the substrate stage 22 is movable in six directions which are X, Y, and Z axial directions and the θX, θY, and θZ directions.

The interferometer system 23 includes a first interferometer unit 23A which optically measures the position of the mask stage 21 (the mask M) in the XY plane, and a second interferometer unit 23B which optically measures the position of the substrate stage 22 (the substrate P) in the XY plane. When the substrate P undergoes an exposure or a predetermined measurement, the first and second drive systems are operated on the basis of the measurement result of the interferometer system 23 to control the positions of the mask stage 21 (the mask M) and the substrate stage 22 (the substrate P).

The exposure apparatus EX in this embodiment is a scanning type exposure apparatus (so-called scanning stepper) which projects the image of the pattern of the mask M onto the substrate P to be transferred while synchronously moving the mask M and the substrate P in a predetermined scanning direction. In this embodiment, the scanning direction (synchronous movement direction) of the substrate P is set to the X axial direction, and the scanning direction (synchronous movement direction) of the mask M is set to the X axial direction. During an exposure of the substrate P, the mask stage 21 moves in the X axial direction from an object surface side of the projection system PS while holding the mask M, and the substrate stage 22 moves in the X axial direction from an image plane side of the projection system PS while holding the substrate P.

In this embodiment, the projection system PS includes a plurality of projection optical systems PL. The plurality of projection optical systems PL are disposed in the XY plane which is substantially parallel to the surface of the substrate P. The illumination system IS includes a plurality of illumination modules IL to correspond to the respective projection optical systems PL. In addition, as described above, the exposure apparatus EX according to this embodiment projects the image of the pattern of the mask M onto the substrate P while synchronously moving the mask M and the substrate P in the predetermined scanning direction (X axial direction). Namely, the exposure apparatus EX according to this embodiment is a so-called multi-lens type scanning exposure apparatus.

In this embodiment, the projection system PS includes the seven projection optical systems PL. The illumination system IS includes the seven illumination modules IL; in addition, the number of projection optical systems PL and the number of illumination modules IL are not limited to seven, and may be at least one.

The projection optical system PL in this embodiment is a non-magnification system (an equal system), but may be one of a de-magnification system or a magnification system. Moreover, the projection optical system PL may be one of a refraction system which does not include a reflective optical device, a reflection system which does not include a refractive optical device, and a reflective refraction system which includes both the reflective optical device and the refractive optical device. Furthermore, the projection optical system PL may form one of an inverted image and an upright image.

In this embodiment, the exposure apparatus EX includes the above-mentioned foreign matter detecting apparatus 10. The foreign matter detecting apparatus 10 is disposed on at least one of a carry-in path (carriage path) on which the mask M is carried to the mask stage 21 and a carry-out path (carriage path) on which the mask M is carried out of the mask stage 21. The exposure apparatus EX may detect whether or not foreign matter adhere to the pellicle 5 of the mask M, for example, before being carried to the mask stage 21 using the foreign matter detecting apparatus 10.

In this embodiment, the foreign matter detecting apparatus 10 includes the support member 9 that supports the mask M; however, the support member 9 may function as a carriage member that may carry the mask M to the mask stage 21. The light projecting unit 11 of the foreign matter detecting apparatus 10 may irradiate the pellicle 5 of the mask M in the state of being supported by the support member 9 with light. The detecting unit 12 may detect foreign mater adhering to the surface of the pellicle 5 on the basis of the light from the pellicle 5. The support member 9 may carry the mask M that undergoes a foreign matter detecting operation to the mask stage 21.

In addition, the support member 9 may function as the carriage member that is able to carry the mask M from the mask stage 21.

In addition, the support member 9 which functions as the carriage member that is able to carry the mask M may carry the mask M without passing through the foreign matter detecting apparatus 10. That is, the support member 9 which functions as the carriage member that is able to carry the mask M may suitably carry the mask M via or without via the foreign matter detecting apparatus 10 (the light projecting unit 11 and the detecting unit 12).

In this embodiment, the exposure apparatus EX includes the foreign matter detecting apparatus 10; however, the foreign matter detecting apparatus 10 may be disposed outside the exposure apparatus EX.

As described above, according to this embodiment, it is possible to suppress the deflection of the pellicle 5 when the mask substrate 1 deflects. Therefore, for example, in the foreign matter detecting apparatus 10, it is possible to ensure good detection precision over the entire surface of the pellicle 5 and it is possible to obtain good detection results over the entire surface of the pellicle 5. Therefore, it is possible to suppress foreign matter detection errors in the foreign matter detecting apparatus 10. Furthermore, in the exposure apparatus EX, it is possible to solve a problem in that, for example, an exposure is performed on the substrate P by irradiating the mask M with the exposure light EL in a state where foreign matter is left adhered to the pellicle 5, and it is possible to suppress exposure degradation.

According to this embodiment, it is possible to perform the exposure while suppressing the deflection of the pellicle 5 by supporting the mask M with the mask stage 21. Furthermore, according to this embodiment, it is possible to carry the mask M while suppressing the deflection of the pellicle 5 using the carriage member (the support member 9).

According to this embodiment, it is possible to achieve economy in space of the mask M in the Z axial direction by suppressing the deflection of the pellicle 5. For example, in an accommodation apparatus which accommodates a plurality of masks M arranged in the Z axial direction, which is called a mask library, it is possible to reduce a space occupied by the plurality of masks M.

In this embodiment, the mask substrate 1 has a rectangular shape which is long in the X axial direction; however, it may have a square shape or have a rectangular shape which is long in the Y axial direction.

Furthermore, in this embodiment, the opening portion 4K has a rectangular shape which is long in the X axial direction; however, it may have a square shape or have a rectangular shape which is long in the Y axial direction. In addition, in this embodiment, the length of the first portion 4A in the Y axial direction is shorter than that of the second portion 4B in the X axial direction; however, the lengths of the first and second portions 4A and 4B may be equal to each other, or the length of the first portion 4A in the Y axial direction may be greater than that of the second portion 4B in the X axial direction.

In this embodiment, the opening portion 4K has a rectangular shape; however, it may have a shape other than the rectangular shape. For example, the second portion 4B does not have a linear shape and may have a curved shape.

<Second Embodiment>

Next, a mask M2 according to a second embodiment will be described. In the following description, like elements or like configurations of the above-mentioned embodiment are denoted by like reference numerals, and detailed description thereof will be simplified or omitted.

Figure 13:
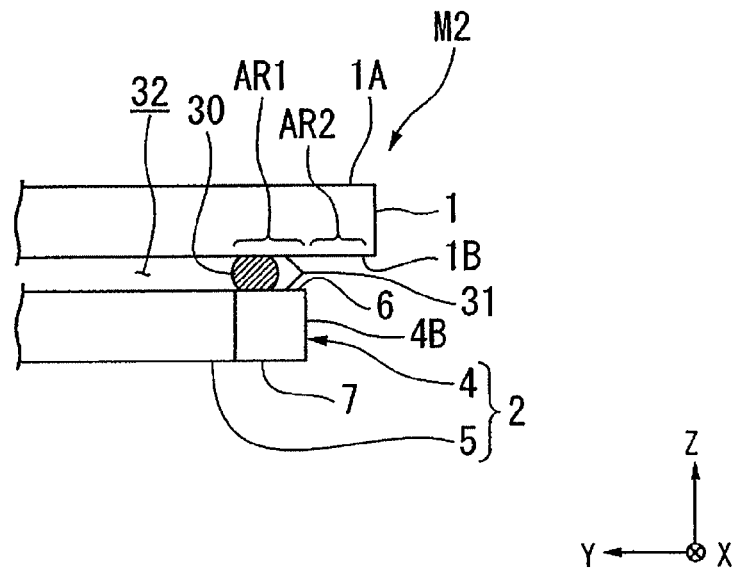
FIG. 13 is a cross-sectional view illustrating an example of a mask according to a second embodiment.
Figure 14:
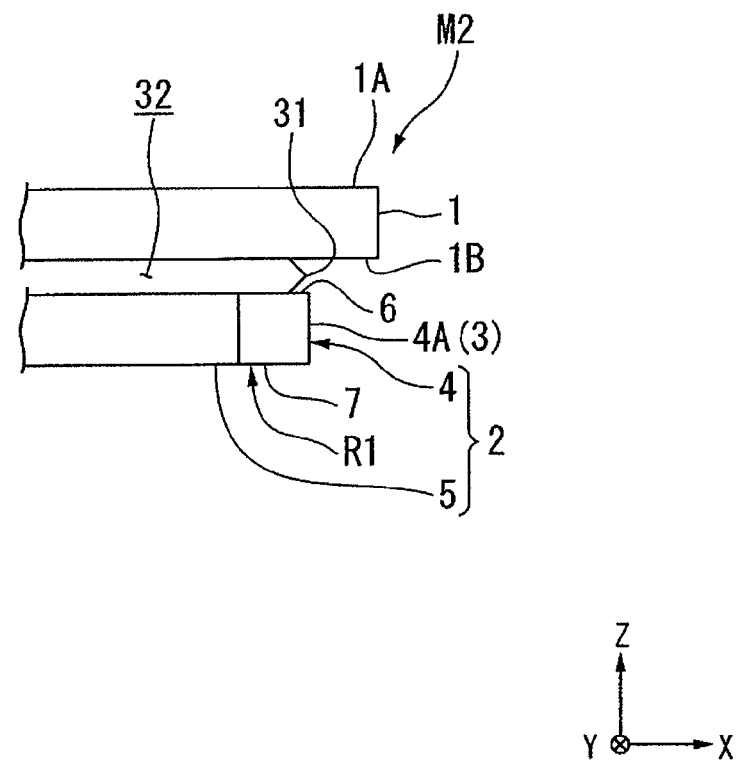
FIG. 14 is a cross-sectional view illustrating the example of the mask according to the second embodiment.

FIGS. 13 and 14 are cross-sectional views illustrating part of the mask M2 according to the second embodiment. In FIGS. 13 and 14, the mask M2 includes a mask substrate 1, a protective apparatus 2 including a pellicle frame 4 and a pellicle 5, and an intermediate layer 30 interposed between the mask substrate 1 and the pellicle frame 4. As in the first embodiment, the pellicle frame 4 includes a first portion 4A and a second portion 4B. A second end surface 7 of the first portion 4A has a curved shape along a deflection curve R1.

FIG. 13 illustrates the cross-section of the mask M2, which is parallel to the YZ plane including the second portion 4B. FIG. 14 illustrates the cross-section of the mask M2, which is parallel to the XZ plane including the first portion 4A. As illustrated in FIGS. 13 and 14, in this embodiment, a first end surface 6 of the pellicle frame 4 opposes a lower surface 1B of the mask substrate 1 at a predetermined interval.

In this embodiment, the intermediate layer 30 is an adhesive portion (bonding portion) for adhering the pellicle frame 4 and the mask substrate 1 to each other. In this embodiment, the intermediate layer 30 is interposed between part of the first end surface 6 of the pellicle frame 4 and a first area AR1 of the lower surface 1B.

In this embodiment, the intermediate layer 30 is interposed between the first end surface 6 of the second portion 4B of the pellicle frame 4 and the first area AR1 of the lower surface 1B of the mask substrate 1.

In this embodiment, the deflection curve R1 of the first portion 4A is determined on the basis of a thickness distribution of the intermediate layer 30.

In a case where the intermediate layer 30 has a predetermined thickness distribution, there is a possibility that the shape of the second end surface 7 may change when the mask substrate 1 deflects due to its own weight according to the thickness distribution.

For this reason, in this embodiment, the deflection curve R1 in a reference state is determined on the basis of the thickness distribution of the intermediate layer 30. Accordingly, in the case where the mask substrate 1 deflects due to its own weight, the second end surface 7 is disposed in the XY plane, and the pellicle 5 stretched over the second end surface 7 is disposed in the XY plane while suppressing the deflection.

Furthermore, in this embodiment, the mask M2 includes a flexible seal member 31 which is connected to the mask substrate 1 and the pellicle frame 4 for suppressing gas from flowing into an internal space 32 formed by the mask substrate 1, the pellicle frame 4, and the pellicle 5 between the mask substrate 1 and the pellicle frame 4. The seal member 31 may be a bellows member and is able to be bent. In this embodiment, the seal member 31 is a metal bellows. It is preferable that the metal bellows be made of a material with little outgas, such as, stainless steel or titanium. Alternatively, the seal member 31 may be a bellows made of a synthetic resin. It is preferable that the bellows made of a synthetic resin be made of a material with little outgas such as a fluorinated resin.

In this embodiment, since the seal member 31 is provided, it is possible to prevent gas from flowing into the internal space 32 (a so-called air path).

<Third Embodiment>

Next, a mask M3 according to a third embodiment will be described. In the following description, like elements or like configurations of the above-mentioned embodiments are denoted by like reference numerals, and detailed description thereof will be simplified or omitted.

Figure 15:
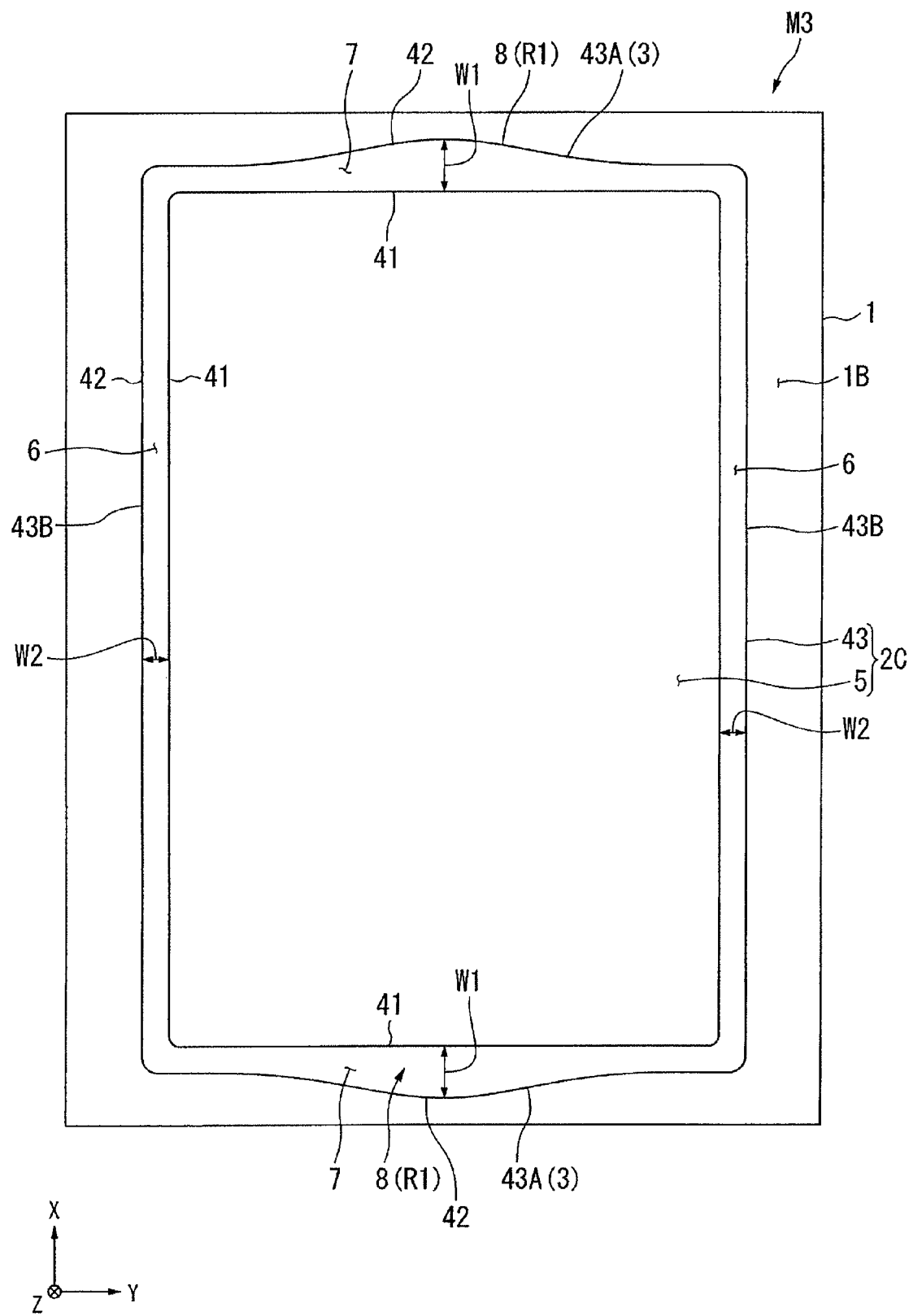
FIG. 15 is a plan view illustrating an example of a mask according to a third embodiment.

FIG. 15 is a view of the mask M3 according to the third embodiment, as viewed from the −Z side. In FIG. 15, the mask M3 includes a mask substrate 1 and a protective apparatus 2C including a pellicle frame 43 and a pellicle 5. The pellicle frame 43 includes a first portion 43A including a flexible portion 3 and a second portion 43B which is different from the first portion 43A. A second end surface 7 of the first portion 43A has a curved shape along a deflection curve R1.

In this embodiment, a width W1 of at least a part of the first portion 43A including the flexible portion 3 is greater than a width W2 of the second portion 4B.

A width of the pellicle frame 43 is a dimension in the XY plane which is substantially parallel to a lower surface 1B of the mask substrate 1. Namely, the width W1 of the first portion 43A which is long in the Y axial direction includes a dimension of the first portion 43A in the X axial direction, and the width W2 of the second portion 43B which is long in the X axial direction includes a dimension of the second portion 43B in the Y axial direction.

In this embodiment, the pellicle frame 43 includes an inner surface 41 which contacts the center of the pellicle frame 43, and an outer surface 42 which faces outward from the center. In this embodiment, the inner surface 41 is substantially perpendicular to a first end surface 6 and the second end surface 7. The outer surface 42 is substantially perpendicular to the first end surface 6 and the second end surface 7.

The width W1 includes a distance between the inner surface 41 and the outer surface 42 of a predetermined portion of the first portion 43A where a vertex (vertex of a concave portion 8) of the deflection curve R1 is formed. The width W2 includes a distance between the inner surface 41 and the outer surface 42 of the second portion 4B.

As illustrated in FIG. 15, in this embodiment, the outer surface 42 of the predetermined portion of the first portion 43A protrudes outward.

In this embodiment, the width W1 of the first portion 43A including the flexible portion 3 in the Y axial direction changes to correspond to a height H1 of the first portion 43A. In other words, the width W1 in the Y axial direction changes with the deflection curve R1.

In this embodiment, the shape of the outer surface 42 of the predetermined portion in the XY plane has a shape conforming to the deflection curve R1 in the YZ plane.

For example, in the case where the second end surface 7 of the first portion 43A is formed in a curved shape along the deflection curve R1, in other words, in the case where the second end surface 7 of the first portion 43A is provided with the concave portion 8, there is a possibility that the strength of the center portion of the first portion 43A is different from that of the end portions of the first portion 43A. For example, there is a possibility that tensions applied to the pellicle 5 at the center portion and at the end portion of the first portion 43A are different; namely, there is a possibility that a tensile strength of the pellicle 5 various with the position of the first portion 43A.

In this embodiment, the dimension (height) of the first portion 43A in the Z axial direction is smaller than the dimension (height) of the second portion 43B; however, the dimension (width) of the first portion 43A in the XY direction is greater than the dimension (width) of the second portion 43B, thereby applying a uniform tension to the pellicle 5. Therefore, it is possible to further suppress the deflection of the pellicle 5.

The substrate P of the first to third embodiments is not limited to a glass substrate for a display device, and can also be adapted to, for example, a semiconductor wafer for fabricating semiconductor devices, a ceramic wafer for a thin film magnetic head, or an original plate (synthetic quartz, silicon wafer) of a mask or a reticle used by an exposure apparatus.

The substrate P of the first to third embodiment is not limited to the above-mentioned glass substrate, the semiconductor wafer, the ceramic wafer, and the like, and can also be applied to a sheet-shaped substrate (for example, a substrate of which a ratio of thickness to area is smaller than those of the glass substrate and the semiconductor wafer) having flexibility. In this case, as a substrate movement apparatus for holding and moving the substrate P, for example, a mechanism for holding both end portions of a sheet-shaped substrate with respective rollers and transporting the substrate from the one roller to the other roller. In such a roller type substrate movement apparatus, a roller or the like for biasing a transport movement of the sheet-shaped substrate transported between the two rollers may further be included.

In addition, the exposure apparatus EX can also be applied to, as well as a step-and-scan type scanning type exposure apparatus (a scanning stepper) that scans and exposes the substrate P with the exposure light EL through the pattern of the mask M by synchronously moving the mask M and the substrate P, a step-and-repeat type projection exposure apparatus (a stepper) that performs a full-field exposure of the pattern of the mask M in a state where the mask M and the substrate P are stationary, and then sequentially steps the substrate.

In addition, the present invention can also be adapted to a twin stage type exposure apparatus, which is provided with a plurality of substrate stages, as disclosed in, for example, U.S. Pat. Nos. 6,341,007, 6,208,407, and 6,262,796.

In addition, the present invention can also be adapted to an exposure apparatus that is provided with a substrate stage that holds the substrate, and a measurement stage that does not hold the substrate and whereon a fiducial member (wherein a fiducial mark is formed) and various photoelectric sensors are mounted, as disclosed in U.S. Pat. No. 6,897,963 and Europe Patent Application, Publication No. 1,713,113. Alternatively, an exposure apparatus including a plurality of substrate stages and measurement stages may be employed.

The type of exposure apparatus EX is not limited to an exposure apparatus that is used for fabricating liquid crystal display devices, but can also be widely applied to an exposure apparatus that is used for fabricating organic EL displays, an exposure apparatus that is used for fabricating semiconductor devices that expose the substrate P with the pattern of a semiconductor device, and an exposure apparatus that is used for fabricating thin film magnetic heads, image capturing devices (CCDs), micromachines, MEMS, DNA chips, or reticles and masks.

In addition, in the embodiments described above, positional information of each stage is measured using an interferometer system including a laser interferometer; however, the embodiments are not limited thereto, and may use, for example, an encoder system which detects a scale (diffraction grating) provided at each stage.

Furthermore, in the embodiments discussed above, a light transmitting type mask is used wherein a predetermined shielding pattern (or a phase pattern or a dimming pattern) is formed on a light transmitting substrate; however, instead of such a mask, it is also possible to use a variable forming mask wherein a transmittance pattern, a reflected pattern, or a light emitting pattern is formed based on electronic data of the pattern to be exposed, as disclosed in, for example, U.S. Pat. No. 6,778,257; here, variable forming masks, which are also called electronic masks, active masks, or image generators. Alternatively, instead of the variable forming masks having a non light emitting image display device, pattern forming apparatuses including a light emitting image display device may be provided.

The exposure apparatus EX of the above-described embodiments is manufactured by assembling various subsystems, including each constituent element exemplified in the claims, so that a predetermined mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus from these various subsystems, there are also the processes of assembling each individual subsystem. When the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 16:
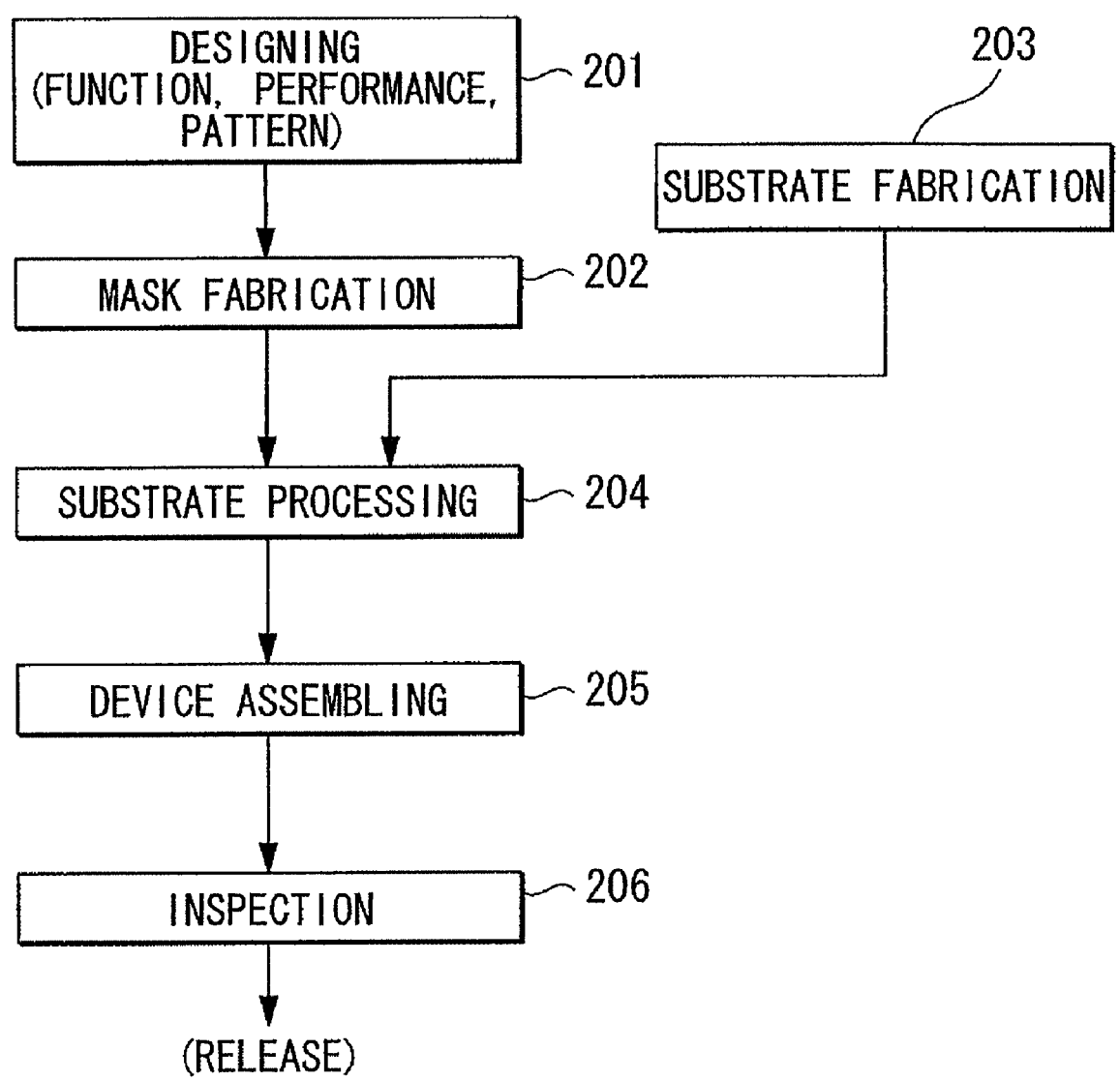
FIG. 16 is a flowchart for explaining an example of a microdevice fabricating process.

As shown in FIG. 16, a microdevice such as a semiconductor device is fabricated by performing step 201 of designing functions and performances of microdevices, step 202 of fabricating a mask (reticle) based on the designing step, step 203 of fabricating a substrate which is a base of the device, substrate processing step 204 including substrate processes (exposure) such as irradiating the substrate P with the exposure light EL from the mask M using the exposure apparatus EX according to the embodiment, transferring the pattern of the mask M on the substrate P, developing the substrate P on which the pattern is transferred, and forming the transfer pattern layer having a shape corresponding to the pattern on the substrate P, device assembling step (including processes such as the dicing, bonding, and packaging) 205 including processing of the substrate P through the transfer pattern layer, and inspection step 206. In addition, in step 204, forming an exposure pattern layer (layer of the developed photosensitive agent) corresponding to the pattern of the mask by developing the photosensitive agent, and processing the substrate using the exposure pattern layer are included.

Besides the semiconductor device, it is possible to fabricate a device including at least a part of the substrate P by transferring a pattern of one of the masks M, M2, and M3 according to the first to third embodiments and processing on the basis of the pattern the substrate P on which the pattern is transferred. Here, as the processing of the substrate P based on the transferred pattern, etching the substrate P on the basis of the transferred pattern, printing on the substrate P on the basis of the transferred pattern (applying a predetermined material such as a conductive ink on the basis of the transferred pattern), and the like may be applied.

In addition, in the embodiments described above, the protective apparatus 2 protects the pattern area PA of the mask substrate 1; however, an object to be protected by the protective apparatus 2 is not limited to the mask substrate 1. In a case of protecting predetermined areas in various substrates, which are objects to be protected, a protective apparatus having a frame portion and a thin film portion that is stretched across the frame portion may be used.

In addition, requirements of the embodiments and the modified example described above may be suitably combined. In addition, there may be a case where some constituent members are not used. Furthermore, As far as is permitted, the contents of the disclosures in Application and Publications and U.S. patents related to the exposure apparatus referred to in the embodiments and modified examples described above are referred as parts of the description.

What is claimed is:

1. A protective apparatus that protects a predetermined area on a surface of a substrate, comprising:
    a frame portion that includes a pair of flexible portions which are disposed along a first direction and oppose each other, and is connected to the surface of the substrate to surround the predetermined area; and
    a thin film portion that is stretched across the frame portion to oppose the predetermined area and closes an opening portion formed by the frame portion,
    wherein an end surface of the flexible portion on the thin film portion side has a curved shape which is concave toward a connecting portion with the substrate.

2. The protective apparatus according to claim 1, wherein the end surface of the flexible portion on the thin film portion side has a curved shape along a predetermined deflection curve.

3. The protective apparatus according to claim 2, wherein the predetermined deflection curve is a curve complementary to a deflection curve formed by the predetermined area in a state where both end portions of the substrate in the first direction are supported from the thin film portion side.

4. The protective apparatus according to claim 1, wherein portions of the frame portion, which are different from the flexible portions, are formed so that an end surface on the thin film portion side is parallel to an end surface of the connecting portion side.

5. The protective apparatus according to claim 1, wherein a width of at least a part of the flexible portion is greater than a width of the portion of the frame portion which is different from the flexible portion.

6. A mask comprising:
  a substrate having a pattern area on its surface; and
  a protective apparatus that is connected to the surface and protects the pattern area according to claim 1.

7. A mask that is provided with a pattern area on a surface of a substrate, comprising:
  a frame portion that includes a pair of flexible portions which are disposed along a first direction and oppose each other, and is connected to the surface of the substrate to surround the pattern area; and
  a thin film portion that is stretched across the frame portion to oppose the pattern area and closes an opening portion formed by the frame portion,
  wherein an end surface of the flexible portion on the thin film portion side has a flat shape in a state where both end portions of the substrate in the first direction are supported from the thin film portion side.

8. The mask according to claim 7, wherein the end surface of the flexible portion on the thin film portion side has a curved shape which is concave toward the substrate side along a predetermined deflection curve in the state where the end surface on the substrate side is flat.

9. The mask according to claim 8, wherein the predetermined deflection curve is a curve complementary to a deflection curve formed by the pattern area in the state where both end portions of the substrate in the first direction are supported from the thin film portion side.

10. The mask according to claim 9, wherein the predetermined deflection curve is determined on the basis of at least one of a thickness of the substrate, an interval between support portions of the substrate in the first direction, a property value related to rigidity of the substrate, and a specific gravity of the substrate.

11. The mask according to claim 9, further comprising an intermediate layer interposed between the substrate and the frame portion,
  wherein the predetermined deflection curve is determined on the basis of a thickness distribution of the intermediate layer.

12. The mask according to claim 7, wherein portions of the frame portion, which are different from the flexible portions, are formed so that an end surface on the thin film portion side is parallel to an end surface on the substrate side.

13. The mask according to claim 7, wherein a width of at least a part of the flexible portion is greater than a width of the portion of the frame portion which is different from the flexible portion.

* * * * *